(12) United States Patent
Jhou et al.

(10) Patent No.: US 9,029,932 B2
(45) Date of Patent: May 12, 2015

(54) PROGRAMMABLE DEVICE WITH IMPROVED COUPLING RATIO THROUGH TRENCH CAPACITOR AND LIGHTLY DOPED DRAIN FORMATION

(71) Applicant: United Microelectronics Corp., Hsinchu (TW)

(72) Inventors: Ze-Wei Jhou, Hsinchu County (TW); Ching-Chung Yang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/010,611

(22) Filed: Aug. 27, 2013

(65) Prior Publication Data

US 2015/0060980 A1 Mar. 5, 2015

(51) Int. Cl.
*H01L 29/788* (2006.01)
*H01L 29/78* (2006.01)
*H01L 29/66* (2006.01)

(52) U.S. Cl.
CPC .......... *H01L 29/7889* (2013.01); *H01L 29/788* (2013.01); *H01L 29/7831* (2013.01); *H01L 29/66825* (2013.01)

(58) Field of Classification Search
None
See application file for complete search history.

(56) References Cited

U.S. PATENT DOCUMENTS

| 6,063,664 | A | * | 5/2000 | Chen et al. | 438/259 |
| 7,348,621 | B2 | * | 3/2008 | Moore | 257/300 |
| 7,663,180 | B2 | * | 2/2010 | Tagaki | 257/318 |
| 8,305,805 | B2 | * | 11/2012 | Liu | 365/185.03 |
| 8,890,225 | B2 | * | 11/2014 | Liao et al. | 257/298 |
| 2011/0073924 | A1 | * | 3/2011 | Shih et al. | 257/298 |
| 2012/0264264 | A1 | * | 10/2012 | Chen et al. | 438/266 |

* cited by examiner

*Primary Examiner* — Marc Armand
*Assistant Examiner* — Younes Boulghassoul
(74) *Attorney, Agent, or Firm* — WPAT, PC; Justin King

(57) ABSTRACT

A programmable device and a method of manufacturing the same are provided. A programmable device comprises a substrate having a source region, a drain region and a diffusion region adjacent to the source region and the drain region; a channel coupling the source region and the drain region; a floating gate formed of a conductive material and positioned on the substrate and corresponding to the channel; and a trench formed in the diffusion region at the substrate, wherein the floating gate extends to the trench, and the conductive material covers a sidewall of the trench.

10 Claims, 6 Drawing Sheets

PROGRAMMABLE DEVICE WITH IMPROVED COUPLING RATIO THROUGH TRENCH CAPACITOR AND LIGHTLY DOPED DRAIN FORMATION

BACKGROUND

1. Technical Field

The disclosure relates in general to a programmable device and a method of manufacturing the same, and more particularly to a programmable device with improved coupling ratio and a method of manufacturing the same.

2. Description of the Related Art

Reduction of feature size, improvements of the rate, the efficiency, the density and the cost per integrated circuit unit are the important goals in the semiconductor technology. With the development of semiconductor technology, multiple time programmable (MTP) memories have been provided for beneficial use in many applications. It is desired to increase the programming speed and erasing speed of the MTP cell under the conditions of maintaining the recent size or preferably decreasing the size of the device.

SUMMARY

The disclosure is directed to a programmable device and a method of manufacturing the same, in which a coupling area between a floating gate and a diffusion region is increased by forming the trenches within the diffusion region, and sidewalls of the trenches are deposited with the conductive material of the floating gate, thereby improving the electrical characteristics of the programmable device.

According to the embodiment, a programmable device is provided, comprising a substrate having a source region, a drain region and a diffusion region adjacent to the source region and the drain region; a channel coupling the source region and the drain region; a floating gate formed of a conductive material and positioned on the substrate and corresponding to the channel; and a trench formed in the diffusion region at the substrate, wherein the floating gate extends to the trench, and the conductive material covers a sidewall of the trench.

According to the embodiment, a method of manufacturing a programmable device is provided, comprising providing a substrate having a source region, a drain region and a diffusion region adjacent to the source region and the drain region, and a channel coupling the source region and the drain region; forming a trench in the diffusion region at the substrate; and forming a floating gate made of a conductive material and positioned on the substrate, the floating gate extending to the trench and the conductive material covering a sidewall of the trench.

DETAILED DESCRIPTION

Figure 1:
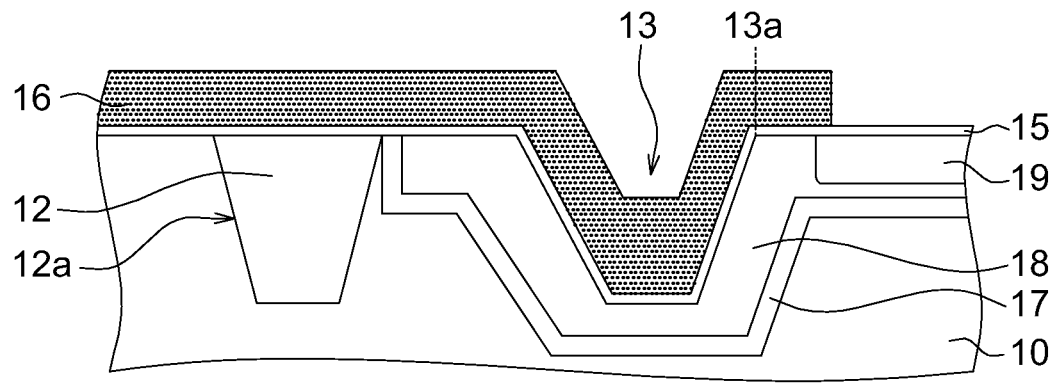
FIG. 1 is a cross-sectional view of a portion of a programmable device according to one embodiment of the present disclosure.

In the present disclosure, a programmable device and a method of manufacturing the same are provided. According to the embodiment, plural trenches are respectively formed within the diffusion regions of a programmable device by extending downwardly at the substrate, and the trenches are deposited with the conductive material. Therefore, the coupling area between the floating gate and the diffusion region of the programmable device is increased, thereby improving the coupling ratio for programmable device. Consequently, the programming speed and erasing speed of the programmable device manufactured by the method of the embodiment are raised, and the electrical characteristics of the device are greatly improved.

The present disclosure is, but not limitedly, applied to a multiple time programming (MTP) cell by constructing a trench in the diffusion region. The manufacturing methods of the embodiments would be slightly different, and could be modified and changed according to the procedures in practical applications. For example, trenches of the embodiments could be formed with the silicon trench isolation (STI) patterning simultaneously. Alternatively, trenches of the embodiments could be formed after the STI process. Also, the embodiment of the disclosure could be implemented for different layouts. Embodiments are provided hereinafter with reference to the accompanying drawings for describing the related configurations and procedures, but the present disclosure is not limited thereto. The identical and/or similar elements of the embodiments are designated with the same and/or similar reference numerals.

It is noted that not all embodiments of the invention are shown. Modifications and variations can be made without departing from the spirit of the disclosure to meet the requirements of the practical applications. Thus, there may be other embodiments of the present disclosure which are not specifically illustrated. It is also important to point out that the illustrations may not be necessarily be drawn to scale. Thus, the specification and the drawings are to be regard as an illustrative sense rather than a restrictive sense.

Figure 2:
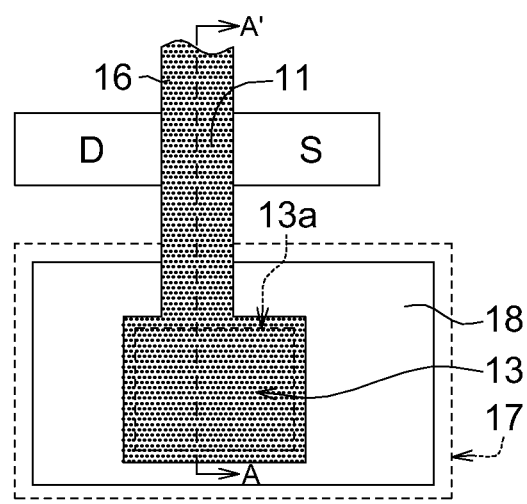
FIG. 2 is a top view of a programmable device according to one embodiment of the present disclosure.

FIG. 1 is a cross-sectional view of a portion of a programmable device according to one embodiment of the present disclosure. FIG. 2 is a top view of a programmable device according to one embodiment of the present disclosure. According to an embodiment, a programmable device comprises a substrate 10 having a source region S, a drain region D, and a diffusion region 18 adjacent to the source region S and the drain region D; a channel 11 coupling the source region S and the drain region D; a floating gate 16 formed of a conductive material and positioned on the substrate 10 and corresponding to the channel 11; and a trench 13 formed in the diffusion region 18 at the substrate 10. The floating gate 16 extends to the trench 13, and the conductive material of the floating gate 16 covers a sidewall of the trench 13. Since the floating gate 16 extends to the trench 13, the trench 13 is electrically coupled to the floating gate 16.

Also, a programmable device of an embodiment may further comprise plural silicon trench isolations (STI) 12 at the substrate 10. A doping region 19 such as N+ region is formed at the substrate 10. The trenches 13 of the embodiments could be formed with the silicon trench isolations (STI) 12 patterning simultaneously. However, the disclosure is not limited hereto. It is also possible that the trenches 13 of the embodiments are formed after the STI process. The manufacturing methods of the programmable device of the embodiments are described later.

In one embodiment, the conductive material of the floating gate 16 covers the sidewall and a bottom surface of the trench 13, as shown in FIG. 1 and FIG. 2. The conductive material could be formed as a liner for the trench 13 (FIG. 1), or fully filled the trench 13, which is not particularly limited in applications. In one embodiment, when a programming voltage is applied across the source region S and the drain region D, the drain region D is capacitively coupled to the floating gate 16 and the conductive material of the trench 13 due to the conductive material covering the sidewall of the trench 13.

Also, the filling area of the conductive material within the trench 13 can be substantially equal to an opening area of the trench 13; for example, the conductive material is only deposited on the bottom and sidewall of the trench 13 and does not rune run out of the trench 13. Therefore, a distal end of the conductive material in of one embodiment is substantiality aligned with an opening edge 13a of the trench 13. Alternatively, the filling area of the conductive material within the trench 13 can be slightly larger then an opening area of the trench 13; for example, the conductive material deposited on the bottom and sidewall of the trench 13 slightly overflows the trench 13, but cannot overflow the diffusion region 18. As shown in FIG. 1 and FIG. 2, a distal end of the conductive material in of one embodiment can be larger than an opening edge 13a of the trench 13. It is known by the people skilled in the art that the shapes of the trench 13 is not limited to what is shown in the drawings, wherein the sidewalls of the trench 13 can be slanted sidewalls, vertical sidewalls, arc sidewalls, etc.

Moreover, the programmable device of an embodiment further comprises an insulating layer 15 formed on the sidewall of the trench 13, and the conductive material is deposited on the insulating layer 15. Practically, a tunneling oxide or a liner oxide could be formed as the insulating layer 15 between the conductive material and the trench 13.

Also, in one embodiment, the programmable device may comprise a lightly doped drain (LDD) implant area 17 formed at the substrate 10 and associated with the diffusion region 18. Formation of cell LDD implant is an optional step. If a sufficiently high doping concentration of the N+ region (including the source and drain regions S/D) of the programmable device (ex: MTP cell) is achieved, formation of cell LDD implant could be eliminated. If the doping concentration of the N+ region (including the source and drain regions S/D) of the programmable device is insufficient, the programming/erasing speed could be improved by forming the cell LDD implant area 17.

According to the embodiment illustrated above, the coupling area between the floating gate and diffusion region of the programmable device (such as a MTP cell) is increased by forming the trenches 13 within the diffusion regions 18 and extending downwardly at the substrate 10, wherein the trenches 13 are filled with conductive material which is also the same material of the floating gate 16 (such as polysilicon). Therefore, the coupling area between the floating gate 16 and diffusion region 18 of the embodiment has been increased at least by additional sidewall areas of the trenches 13 (ex: four sidewalls of each trench), thereby improving the coupling ratio for the programmable device (ex: MTP cell). The programming speed and erasing speed of the programmable device are raised consequently.

[Layout]

Figure 3:
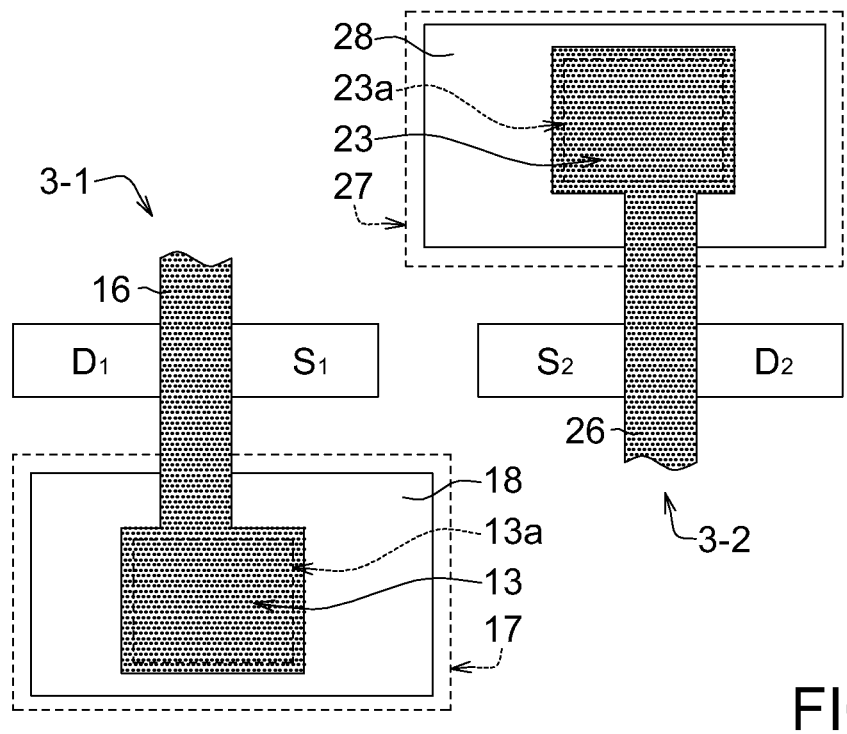
FIG. 3 schematically illustrates one type of layouts implemented by the embodiment of the present disclosure, which the adjacent structures/units are arranged inversely in a row direction of the layout.
Figure 4:
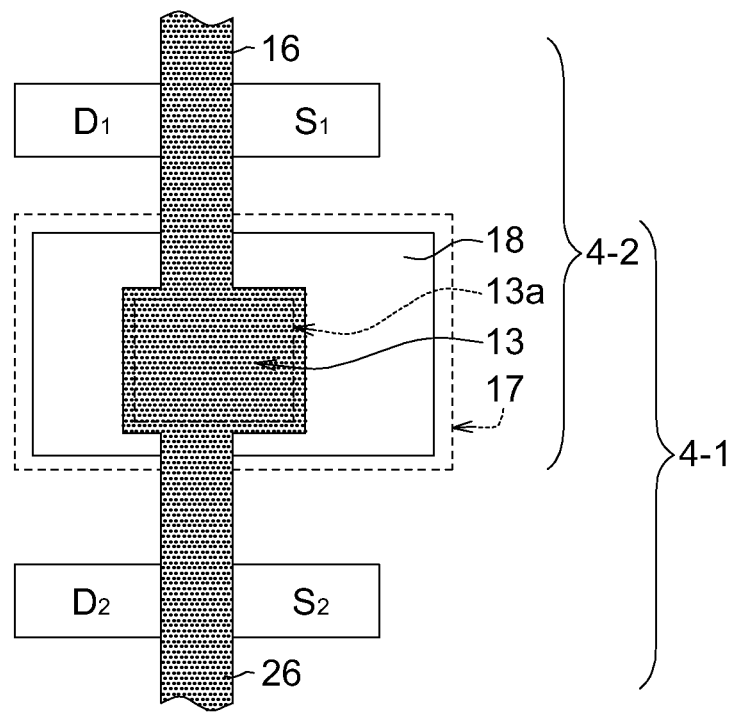
FIG. 4 schematically illustrates another type of layouts implemented by the embodiment of the present disclosure, which the adjacent structures/units share a trench in a column direction of the layout.

The embodiment of the present disclosure could be implemented for constructing different layouts. Two embodiments are provided herein, not limitedly, for illustration the layout implementations. FIG. 3 schematically illustrates one type of layouts implemented by the embodiment of the present disclosure, which the adjacent structures/units are arranged inversely in a row direction of the layout. FIG. 4 schematically illustrates another type of layouts implemented by the embodiment of the present disclosure, which the adjacent structures/units share a trench in a column direction of the layout. A more compact layout can be achieved when the configuration of FIG. 4 is applied for device arrangement.

In FIG. 3, the programmable device comprises a first structure/unit 3-1 as described above (please see FIG. 1 and FIG. 2), and further comprises a second structure/unit 3-2. The second structure/unit 3-2 comprises another source region $S_2$, another drain region $D_2$ and another diffusion region 28 on the substrate 10, and the source region $S_2$ and the drain region $D_2$ of the second structure/unit 3-2 are adjacently arranged with the source region $S_1$ and the drain region $D_1$ of the first structure/unit 3-1 in a row direction. The second structure/unit 3-2 further comprises another trench 23 formed in the another diffusion region 28 at the substrate 10, another floating gate 26 formed of the conductive material and extending to the trench 23, wherein the trench 13 of the first structure/unit 3-1 and the trench 23 of the second structure/unit 3-2 are disposed at different rows of the layout.

In FIG. 4, the programmable device comprises a first structure/unit 4-1 (please see FIG. 1 and FIG. 2) and a second structure/unit 4-2, wherein both structures/units of the layout share a trench in a column direction to achieve a compact layout. The second structure/unit 4-2 comprises another source region $S_2$ and another drain region $D_2$ on the substrate 10, and arranged with the source region $S_1$ and the drain region $D_1$ of the first structure/unit 4-1 in a column direction. As shown in FIG. 4, the trench 13 is positioned between the source regions $S_1$, $S_2$, and the drain regions $D_1$, $D_2$. The second structure/unit 4-2 further comprises another floating gate 26 extending to the trench 13 and coupled to the conductive material at the trench 13. In one embodiment, the floating gates 16 and 26 can be configured simultaneously by forming and patterning the same conductive material.

[Manufacturing Method]

The methods of manufacturing the programmable device of the embodiments are described below. It is noted that not all manufacturing methods of embodiments of the disclosure are shown. Step modifications and variations can be made without departing from the spirit of the disclosure to meet the requirements of the practical applications.

Figure 5:
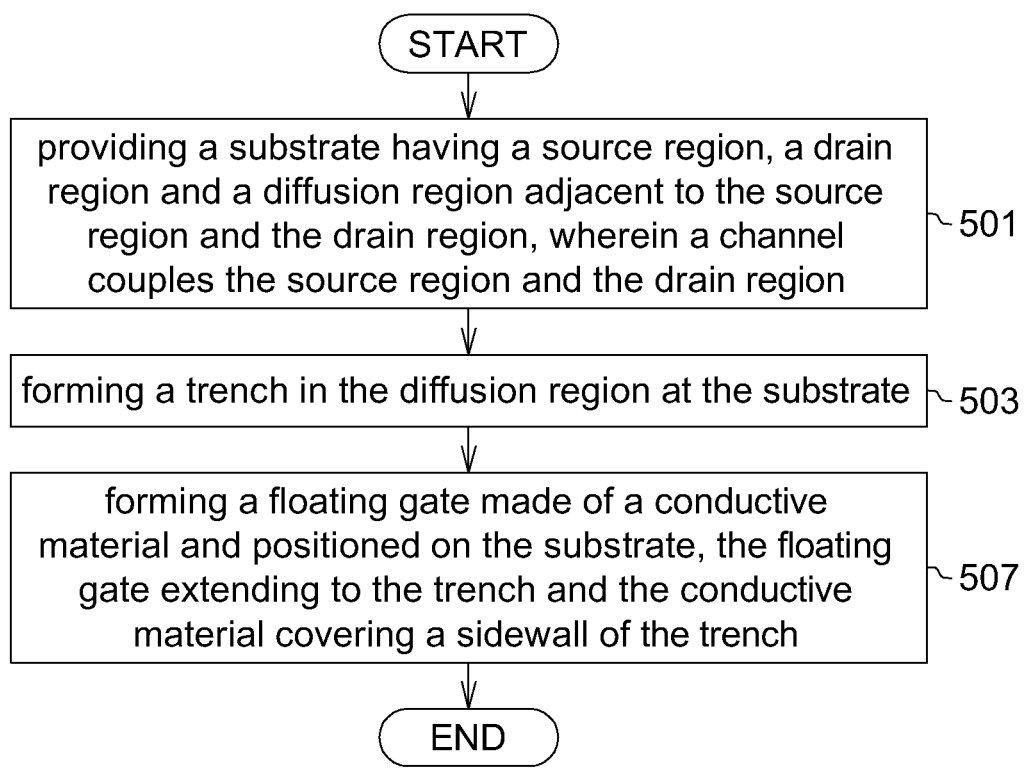
FIG. 5 is a process flow of a manufacturing method of a semiconductor device according to an embodiment of the present disclosure.

FIG. 5 is a process flow of a manufacturing method of a semiconductor device according to an embodiment of the present disclosure. Please also refer to FIG. 1 and FIG. 2. Generally, a method of manufacturing a programmable device of the embodiment comprises steps as depicted in FIG. 5. In step 501, a substrate 10 having a source region S, a drain region D and a diffusion region 18 is provided, wherein the diffusion region 18 is adjacent to the source region S and the drain region D, and a channel 11 couples the source region S and the drain region D.

In one embodiment, the method of manufacturing a programmable device of the embodiment may optionally comprise forming a lightly doped drain (LDD) implant area 17 at the substrate 10 and associated with the diffusion region 18 (as shown in FIG. 2) for improving the electrical characteristic of the device.

In step 503, at least a trench 13 is formed in the diffusion region 18 at the substrate 10. In one embodiment, the method of manufacturing a programmable device of the embodiment may optionally comprise forming an insulating layer 15 such as a tunneling oxide or a liner oxide on the sidewall of the trench 13.

In step 507, a floating gate 16 made of a conductive material is formed and positioned on the substrate 10, and the floating gate 16 extends to the trench 13 and the conductive material covers a sidewall of the trench 13. For example, the conductive material covers the sidewall and a bottom surface of the trench 13, and could be formed as a liner for the trench 13.

In one embodiment with an insulating layer 15 formed on the sidewall of the trench 13, the conductive material is formed on the insulating layer 15. In one embodiment, the conductive material (ex: polysilicon) filled in the trench 13 of the embodiment at least fully cover the sidewalls of the trench 13. In one embodiment, one end of the conductive material could be substantiality aligned with the opening edge of the trench, such as equal to or slightly larger than the opening edge of the trench.

Figure 6:
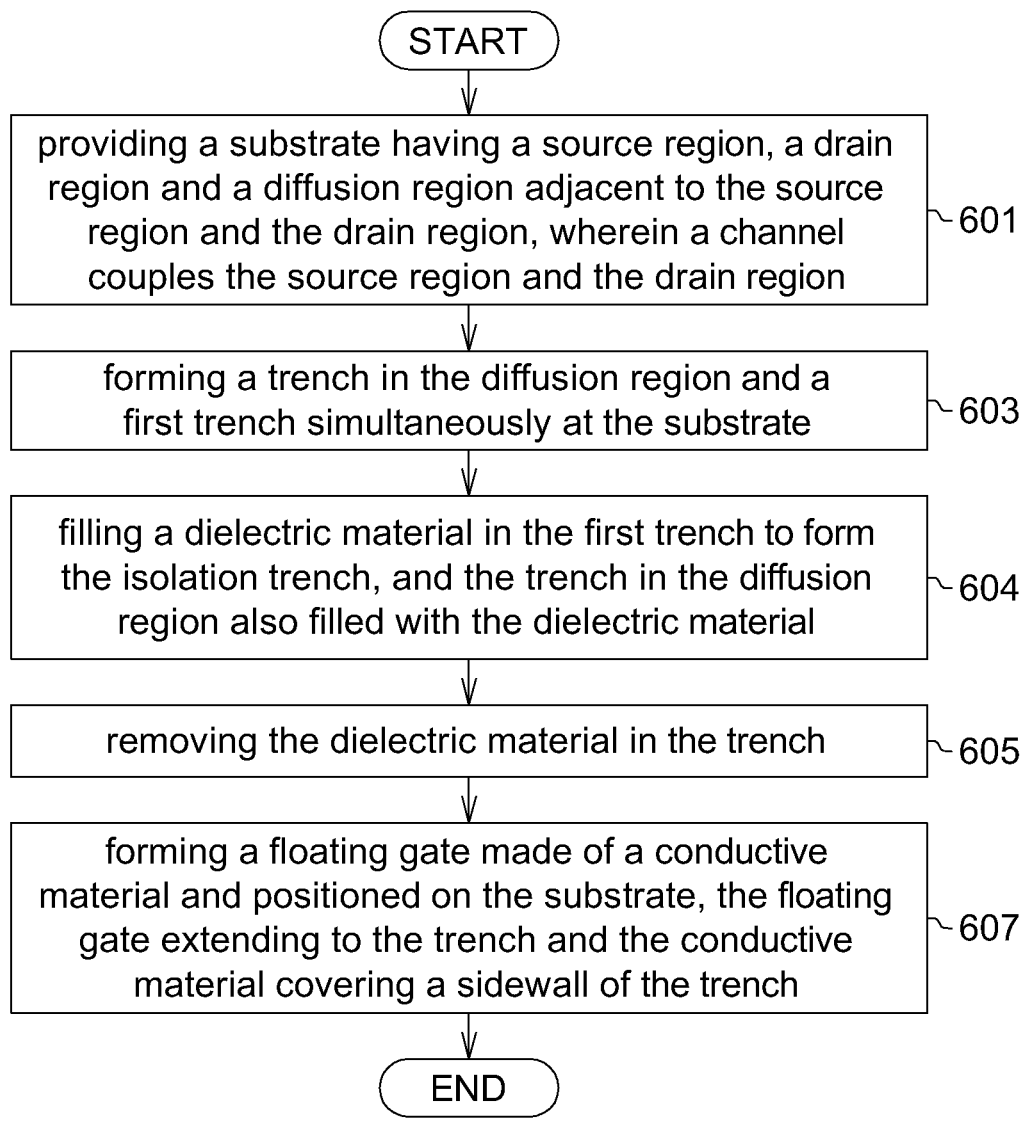
FIG. 6 is a process flow of another manufacturing method of a semiconductor device according to another embodiment of the present disclosure.

Also, a programmable device of an embodiment may further comprise plural silicon trench isolations (STI) 12 at the substrate 10. The trenches 13 of the embodiments could be formed with the silicon trench isolations (STI) 12 patterning simultaneously and the dielectric material (of STI) filling in the trenches is replaced by the conductive material of later. Alternatively, the trenches 13 of the embodiments could be formed after the STI process. FIG. 6 is a process flow of another manufacturing method of a semiconductor device according to another embodiment of the present disclosure. Please also refer to FIG. 1 and FIG. 2. It is noted that FIG. 6 is one of the embodied methods, not described for limiting the disclosure.

In step 601, a substrate 10 having a source region S, a drain region D and a diffusion region 18 is provided, wherein the diffusion region 18 is adjacent to the source region S and the drain region D, and a channel 11 couples the source region S and the drain region D.

In step 603, at least a trench 13 is formed in the diffusion region 18 and a first trench 12a is formed at the substrate 10 simultaneously.

In step 604, a dielectric material is filled in the first trench 12a to form the isolation trench (such as STI 12), and the trench 13 in the diffusion region 18 also filled with the dielectric material.

In step 605, the dielectric material in the trench 13 is removed.

In step 607, a floating gate 16 made of a conductive material is formed and positioned on the substrate 10, and the floating gate 16 extends to the trench 13 and the conductive material covers a sidewall of the trench 13. Therefore, the dielectric material in the trench is replaced by the conductive material.

Similarly, an insulating layer 15 (such as a tunneling oxide) could be optionally formed on the sidewall of the trench 13 before forming the conductive material. Alternatively, a liner oxide could be formed in the first trench 12a and the trench 13 before depositing the dielectric material (for STI), and the liner oxide could be kept in the trench 13 as the insulating layer 15 while step of removing the dielectric material in the trench 13 is performed.

According to the method in FIG. 6, the trench 13 of the embodiment is formed with the STI trench, and the dielectric material formed in the trenches during the STI process is removed, followed by forming tunneling oxide (optional if the liner oxide is remained in the trench 13) and filling the conductive material (ex: polysilicon of the floating gate 16). However, the formations of the trench 13 could be performed after STI formation is completed. It is noted that not all embodied steps of the method of the disclosure are shown. Modifications and variations can be made without departing from the spirit of the disclosure to meet the requirements of the practical applications.

[Improvement of Coupling Area and Simulations—Expressed by Mathematical Analysis]

For a conventional MTP cell (without trenches), a coupling area between the floating gate and diffusion region is represented as:

$$L*W \qquad (1)$$

For a MTP cell of the embodiment (with trenches, and it is assumed that the trench has 4 vertical sidewalls), a coupling area between the floating gate and diffusion region is represented as:

$$L*W+(L+W)*d*2 \qquad (2),$$

wherein:

d is the depth of the trench, L is the length of the top coupling area, and W is the width of the top coupling area.

Comparing formulas (1) and (2), the coupling area improvement of the MTP cell is represented as below:

$$\frac{L*W + (L+W)*d*2}{L*W} - 1 = \frac{(L+W)*d*2}{L*W}$$

In one example, the new coupling area is $L*W+(L+W)*0.4*2$ when the depth of trench is about 0.4 μm, and the increased coupling ratio is $(L+W)*0.4*2/(VW)$.

<Simulation 1>

Figure 7A:
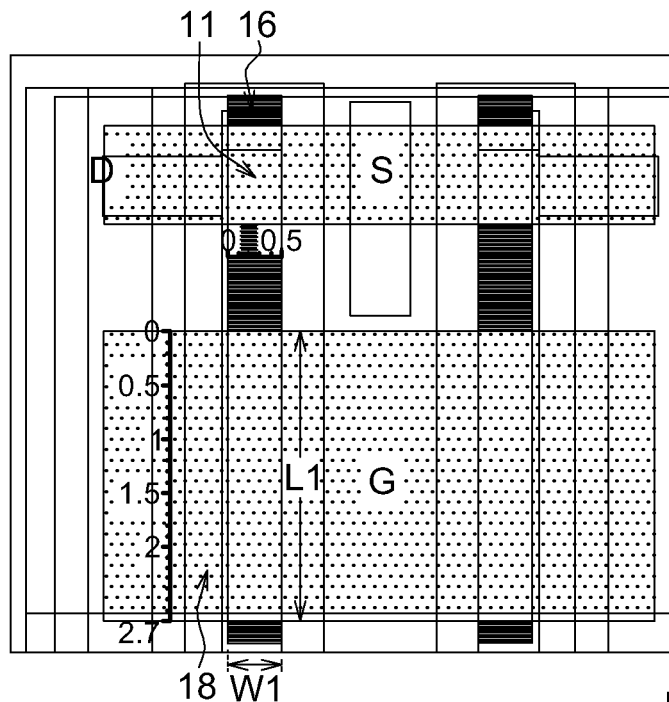
FIG. 7A is a top view of a conventional MTP cell without trench according to Simulation 1.

FIG. 7A is a top view of a conventional MTP cell without trench according to Simulation 1. The coupling area between the floating gate 16 and diffusion region 18 of the conventional MTP cell is generally expressed as $L1*W1$. In FIG. 7A, the coupling area is about 1.35 μm$^2$ (=0.5 μm*2.7 μm).

Figure 7B:
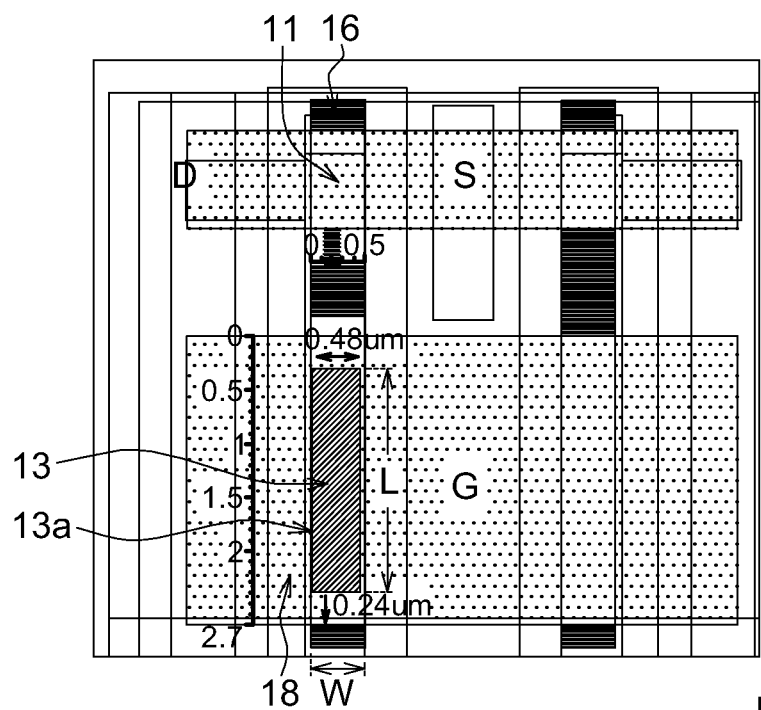
FIG. 7B is a top view of an MTP cell with trenches as illustrated in the embodiment of the disclosure according to Simulation 1.

FIG. 7B is a top view of an MTP cell with trenches as illustrated in the embodiment of the disclosure according to Simulation 1. It is assumed that a depth of the trench 13 (assuming vertical sidewalls) of FIG. 7B is about 0.4 μm, a width (W) is about 0.48 μm and a length (L)(=2.7−0.24*2) is about 2.22 μm, and two opposite vertical sidewalls of the trench 13 have the same area. In FIG. 7B, the coupling area is about 3.51 μm$^2$ (=0.5*2.7+0.48*0.4*2+2.22*0.4*2).

Compared FIG. 7A, FIG. 7B and the results of coupling areas thereof, the coupling area is greatly increased to 3.51 μm$^2$, which is 2.6 times of the conventional one (1.35 μm$^2$), by forming the trenches as illustrated in the embodiment.

<Simulation 2>

Figure 8A:
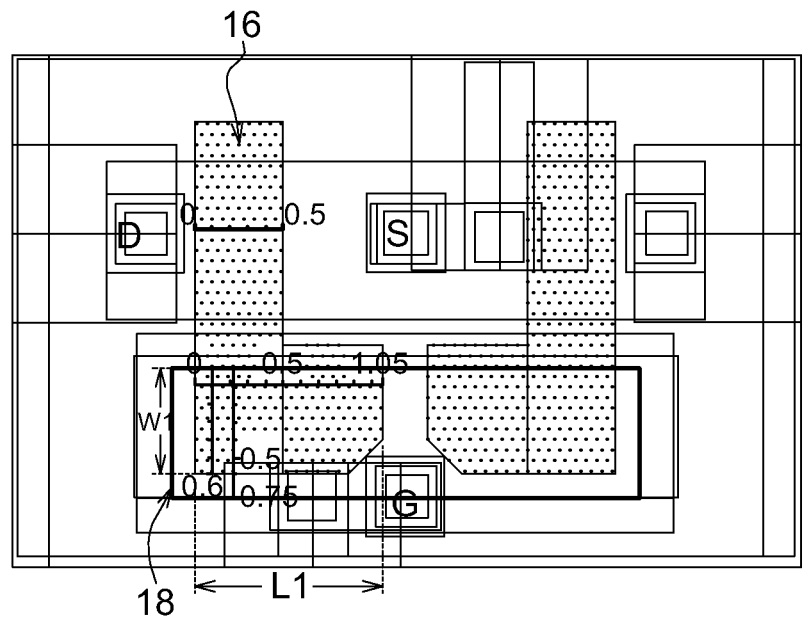
FIG. 8A is a top view of a conventional MTP cell without trench according to Simulation 2.

FIG. 8A is a top view of a conventional MTP cell without trench according to Simulation 2. The coupling area between the floating gate 16 and diffusion region 18 of the conventional MTP cell is generally expressed as $L1*W1$. In FIG. 8A, the coupling area is about 0.642 μm$^2$ (=1.07 μm*0.6 μm).

Figure 8B:
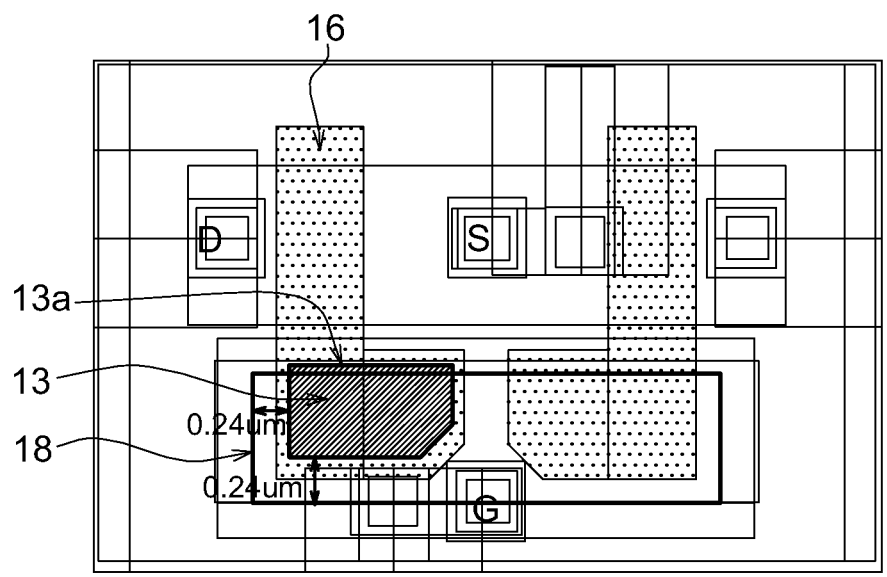
FIG. 8B is a top view of an MTP cell with trenches as illustrated in the embodiment of the disclosure according to Simulation 2.

FIG. 8B is a top view of an MTP cell with trenches as illustrated in the embodiment of the disclosure according to Simulation 2. It is assumed that a depth of the trench 13 (assuming vertical sidewalls) of FIG. 8B is about 0.4 μm, a width of the lower side is about 0.76 μm (=0.87−0.1), and a width of the upper side is about 0.83 μm (=1.07−0.24). It is also assumed that the left and right vertical sidewalls of the trench 13 have the same area for calculation conveniences. In FIG. 8B, the coupling area is about 1.662 μm² (=1.07*0.6+ 0.76*0.4+0.83*0.4+0.48*0.4*2).

Compared FIG. 8A, FIG. 8B and the results of coupling areas thereof, the coupling area is greatly increased to 1.662 μm², which is about 2.59 times of the conventional one (0.642 μm²), by forming the trenches as illustrated in the embodiment.

According to the aforementioned descriptions, a programmable device with a trench and a manufacturing thereof are provided for efficiently increasing the coupling area between the floating gate and diffusion region of the programmable device. Consequently, the coupling ratio for the programmable device is greatly improved, thereby raising the programming speed and erasing speed of the programmable device. Also, the method of manufacturing the programmable device of the embodiment requires no complicated steps, which is compatible for the current procedures and suitable for the mass production.

Other embodiments of the programmable devices with different configurations are also applicable, which could be varied depending on the actual needs of the applications. It is, of course, noted that the configurations of FIG. 1 and FIG. 2 are depicted only for demonstration, not for limitation. It is known by people skilled in the art that structures, layouts and steps of method could be modified adjusted according to the requirements and/or manufacturing methods of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A programmable device, comprising:
    a substrate having a source region, a drain region and a diffusion region adjacent to the source region and the drain region;
    a channel coupling the source region and the drain region;
    a floating gate formed of a conductive material and positioned on the substrate and corresponding to the channel;
    a lightly doped drain (LDD) implant area formed at the substrate and the LDD implant area corresponding to the diffusion region, wherein the LDD implant area encloses the diffusion region; and
    a trench formed in the diffusion region at the substrate, wherein the floating gate extends to the trench, and the conductive material covers a sidewall of the trench.

2. The programmable device according to claim 1, wherein the trench is electrically coupled to the floating gate.

3. The programmable device according to claim 1, wherein a tunneling oxide is formed on the sidewall of the trench, and the conductive material is deposited on the tunneling oxide.

4. The programmable device according to claim 1, wherein the conductive material covers the sidewall and a bottom surface of the trench as a liner for the trench.

5. The programmable device according to claim 1, wherein a distal end of the conductive material is aligned with an opening edge of the trench.

6. The programmable device according to claim 1, wherein a distal end of the conductive material is larger than an opening edge of the trench.

7. The programmable device according to claim 1, wherein the conductive material at least covers the sidewall of the trench to capacitively couple the drain region to the floating gate and the conductive material of the trench when a programming voltage is applied across the source region and the drain region.

8. The programmable device according to claim 1, further comprising:
    another source region and another drain region on the substrate, and arranged with said source region and said drain region in a column direction, wherein the trench is positioned between the another source region, the another drain region and said source and drain regions; and
    another floating gate extending to the trench and coupled to the conductive material at the trench.

9. The programmable device according to claim 1, further comprising:
    another source region, another drain region and another diffusion region on the substrate, and the another source and drain regions adjacently arranged with said source region and said drain region in a row direction;
    another trench formed in the another diffusion region at the substrate;
    another floating gate formed of the conductive material and extending to the another trench;
    wherein the another trench and said trench are at different rows.

10. The programmable device according to claim 1, wherein the diffusion region is formed within the LDD implant area.

* * * * *